United States Patent [19]

Watanabe et al.

[11] Patent Number: 5,159,561

[45] Date of Patent: Oct. 27, 1992

[54] ZERO-PHASE SEQUENCE CURRENT DETECTOR

[75] Inventors: Masami Watanabe; Noboru Mikami, both of Amagasaki; Eiya Aikawa, Tajimi; Yoshinari Furukawa, Tokoname, all of Japan

[73] Assignees: Mitsubishi Denki Kabushiki Kaisha, Tokyo; Chubu Electric Power Company, Incorporated, Nagoya, both of Japan

[21] Appl. No.: 505,153

[22] Filed: Apr. 5, 1990

[30] Foreign Application Priority Data

Apr. 5, 1989 [JP] Japan .................................. 1-86397
Dec. 5, 1989 [JP] Japan .................................. 1-316242

[51] Int. Cl.$^5$ .............................................. H02H 3/16
[52] U.S. Cl. ..................................... 364/483; 361/42; 361/87
[58] Field of Search ................... 364/483, 571.01, 572, 364/573, 576; 361/42, 44, 47, 48, 50, 76, 87, 99; 340/664; 324/424

[56] References Cited

U.S. PATENT DOCUMENTS

| | | | |
|---|---|---|---|
| 3,958,153 | 5/1976 | Narayan | 361/86 |
| 4,343,027 | 8/1982 | Kai | 361/42 |
| 4,529,929 | 7/1985 | Berggren | 324/52 |
| 4,589,046 | 5/1986 | Takata | 361/42 |
| 4,589,048 | 5/1986 | Takata | 361/42 |
| 5,019,956 | 5/1991 | Nakayama | 361/87 |

FOREIGN PATENT DOCUMENTS

| | | |
|---|---|---|
| 0266046 | 7/1985 | European Pat. Off. . |
| 2008345 | 5/1979 | United Kingdom . |
| 2195845 | 4/1988 | United Kingdom . |
| 2199411 | 5/1988 | United Kingdom . |

OTHER PUBLICATIONS

Proceedings of the Seventh Texas Conference on Computing Systems, Oct. 31–Nov. 1, 1978; IEEE, New York, US, pp. 2-5-2-9; B. M. Aucoin et al.; "Overcurrent and High Impedance Fault Relaying Using a Microcomputer".

Primary Examiner—Vincent N. Trans
Attorney, Agent, or Firm—Oblon, Spivak, McClelland, Maier & Neustadt

[57] ABSTRACT

A zero-phase sequence current detector have three circular cores provided around three phases overhead lines of AC power lines, three magnetoptic sensors provided on respective cores for detecting currents flowing on respective power lines, and a processing circuit containing an adding circuit for adding outputs of the magnetoptic sensors and a compensation processing circuit for canceling erroneous components due to the differences of the temperature characteristics among the magnetoptic sensors.

2 Claims, 7 Drawing Sheets

ZERO-PHASE SEQUENCE CURRENT DETECTOR

BACKGROUND OF THE INVENTION

1. Field of the Invention

The present invention relates to a zero-phase sequence current detector for detecting occurrence of zero-phase sequence current due to a ground fault.

2. Description of Prior Art

A conventional zero-phase sequence current detector shown, for example, in "KEIKI YOH HENATSUKI" (Mihoji IKEDA: DENKI SHOIN, Japan P.79, 1962) is described referring to FIG. 6.

Figure 6:
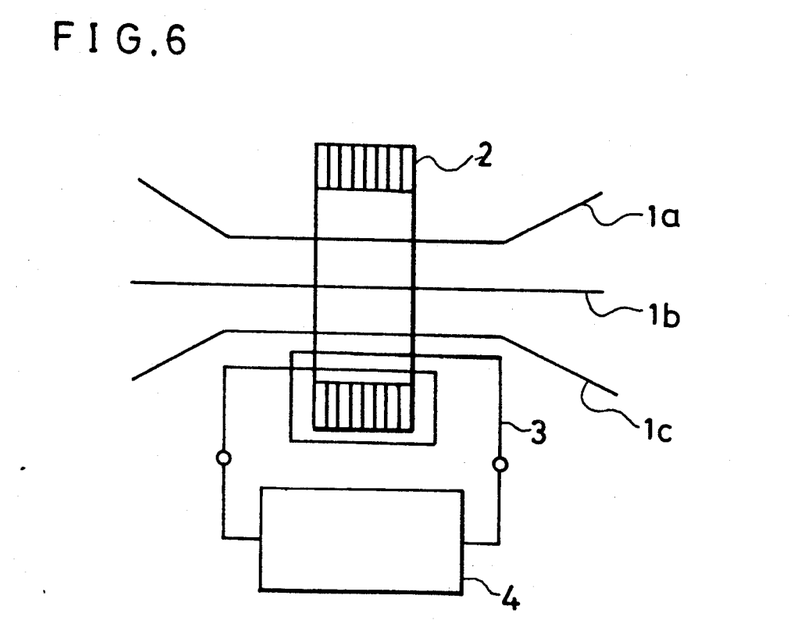
FIG. 6 is the drawing showing the conventional zero-phase sequence current detector.

In FIG. 6, a circular core 2 is provided for enclosing three power lines of respective phases 1a, 1b and 1c. A secondary winding 3 is wound on the circular core 2. A secondary burden 4 is connected to the secondary winding 3.

In stationary case, currents flowing on the power lines of the three phases 1a, 1b and 1c do not contain any components due to an accident, and the respective currents are AC current consisting of positive phase components and opposite phase component respectively having the same amplitude. Magnetic field in the circular core 2 is a composition of magnetic fields induced by the currents flowing on respective phases and resultantly becomes null. As a result, any current does not flow on the secondary winding 3, and the second burden 4 is not driven.

On the contrary, if a ground fault occurs on any one of the power lines of the three phases 1a, 1b and 1c, a sum current value composed bvy the currents flowing on respective phases does not become null. As a result, a zero-phase sequence current flows. When the zero-phase sequence current flows, a magnetic field is induced in the circular core 2 and a secondary current responding to the zero-phase sequence current flows on the secondary winding 3. The secondary burden 4 is driven by the secondary current flowing on the secondary winding 3, and thereby the power lines of the three phases 1a, 1b and 1c are tripped from an electric power source. As a result, magnification of the ground fault is prevented.

Generally, it is desirable that a zero-phase sequence current detector is preferably to be disposed not only in substations but also on overhead lines in the open air for quickly finding out the location where the ground fault occurs and for restricting the power failure area as small as possible.

The conventional zero-phase sequence current detector, however, is constituted to use a circular core 2 which encloses the power lines of the three phases 1a, 1b and 1c together. Accordingly, there are problems that the conventional zero-phase sequence current detector are not suitable to be disposed on the overhead lines and that an accident may be large at a thunder bolt.

Furthermore, when the zero-phase sequence current detector is miniaturized and disposed on the respective phases, an apparent zero-phase sequence current is generated by differences of the temperature characteristics of the respective current detecting devices disposed on the respective phases, and thereby there is a problem that the secondary burden 4 makes maloperation.

SUMMARY OF THE INVENTION

Purpose of the present invention is to provide an improved, small-sized and accurate zero-phase sequence current detector which can be used for overhead lines.

A zero-phase sequence current detector in accordance with the present invention comprises:
current measuring means provided for respective phases of AC power lines for detecting current of the respective phases;
adding means for calculating zero-phase sequence current component by adding signals measured by the measuring means;
first memory means for storing first instantaneous data of at least one newest periodic output of the adding means per a predetermined electrical angle;
second memory means for storing second instantaneous data, which are in the same number as the first instantaneous data stored in the first memory means, the and have been instantaneous data of periodic output of the adding means corresponding to the predetermined electrical angle, detected prior to the first instantaneous data and stored in the first memory means;
first processing means for calculating subtracted data for respective electrical angles by subtracting the second instantaneous data stored in the second memory means from the first instantaneous data stored in the first memory means for respective corresponding electrical angles;
second processing means for calculating a component of the normal frequency only, by expanding the first subtracted data in Fourier series;
third processing means for calculating an effective value from the component of the normal frequency;
fourth processing means which judges whether the effective value is no smaller than a predetermined value or not, erases the second instantaneous data stored in the second memory means and restores the first instantaneous data stored in the first memory means in the second memory means when the effective value is no larger than the predetermined value and maintains the second instantaneous data stored in the second memory means for at least one period of frequency of the AC power lines when the effective value is no smaller than the predetermined value; and
output means for outputting the component of the fundamental frequency calculated by the second processing means to a burden means.

A zero-phase sequence current detector in accordance with the present invention comprises:
current measuring means provided for respective phases of AC power lines for detecting current of the respective phases;
adding means for calculating zero-phase sequence current component by adding signals measured by the measuring means;
first memory means for storing first instantaneous data of at least one newest periodic output of the adding means per a predetermined electrical angle;
second memory means for storing second instantaneous data as a first reference data, which are in the same number as the first instantaneous data stored in the first memory means, and have been instantaneous data of periodic output of the adding means corresponding to the predetermined electrical angle, detected prior to the first instantaneous data and stored in the first memory means;

first processing means for calculating first subtracted data respective electrical angles by subtracting the second instantaneous data stored in the second memory means from the first instantaneous data stored in the first memory means for respective corresponding electrical angles;

second processing means for calculating a component of the normal frequency by expanding the first subtracted data in Fourier series;

third processing means for calculating an effective value from the component of the normal frequency;

third memory means for storing the effective value;

fourth memory means for storing a part effective value, which was calculated by the third processing means prior to the effective value to be stored in the third memory means, as a second reference data;

fourth processing means for calculating second subtracted data by subtracting the second reference data which was stored in the fourth memory means from newest effective value which has been stored in the third memory means;

fifth processing means which judges whether the second subtracted data is no smaller than a predetermined value or not, erases the first and second reference data, restores the newest first instantaneous data stored in the first memory means in the second memory means as a first reference data and restores the newest effective value stored in the third memory means in the fourth memory means as a second reference data when the second subtracted value is no larger than the predetermined value and maintains the first and the second reference data for at least one period of the frequency of the AC power lines when the second subtracted value is no smaller than the predetermined value; and output means for outputting the component of the normal frequency calculated by the second processing means to a burden means.

Hereafter, the operation is elucidate for an example, wherein sampling period is selected to be the length of one period of the frequency of the AC power lines and the predetermined electrical angle is 30°.

The measuring means is constituted by, for example, three magnetoptic sensors using Faraday effect, and three pairs of light emitting devices, optical fibers and photo-sensitive devices. The measuring means for each phase measures the current flowing on the AC power line of a phase and outputs signal which is in proportion to the value of the power current.

The adding means is, for example, an analogue adding circuit or a digital adding circuit using a microprocessor. The adding means adds the values of the currents flowing on the respective phases measured by the measuring means and outputs a sum value. Namely, instantaneous data corresponding to the newest zero-phase sequence current value is outputted from the adding means.

The first, second, third and fourth memory means are constituted by, for example, RAM memories connected to a microprocessor.

The first memory means samples instantaneous data from a periodic output of AC of the adding means for every predetermined electrical angle (30°) and stores therein the respective instantaneous data after digitalizing of them. In this case, twelve of instantaneous data are stored in the first memory means. The data stored in the first memory means are renewed in every samplings.

The second memory means receives instantaneous data which were outputted from the adding means and stored in the first memory means and stores the data as a reference data (or a first reference data). In normal state where no zero-phase sequence current occur, the data stored in the second memory means is renewed to the instantaneous data sampled in just before sampling and stored in the first memory means in every sampling.

The first, second, third, fourth and fifth processing means are respectively constituted by a microprocessor, RAM memory, ROM memory and so on.

The first processing means subtracts respective one of the second instantaneous data (or the first reference data), which has been stored in the second memory means, from the first instantaneous data of corresponding electrical angle stored in the first memory means and calculates the (first) subtracted data of respective electrical angles.

The second processing means expands the (first) subtracted data calculated by the first processing means in the Fourier series, to calculate a component of the normal frequency (50 Hz or 60 Hz).

Generally, erroneous component due to the differences of the temperature characteristics of the measuring means provided on the respective phases does not change in a short time period (such as one second). Therefore, the erroneous component due to the differences of the temperature characteristics of the measuring means can be canceled by subtracting the data sampled before from the newest data. Furthermore, the output of the adding means contains high-frequency and low-frequency components due to the noise which are superposed on the component of the normal frequency. Therefore, such high frequency and low frequency components can be removed by calculating only the component of the fundamental frequency by expending the output of the adding means in Fourier series.

The third processing means calculates an effective value from the component of the normal frequency calculated by the second processing means.

The third memory means stores the effective value calculated by the third processing means.

In an aspect of the invention, the fourth memory means may stores an effective value of the component of the normal frequency which was calculated and stored prior to the newest effective value now stored in the third memory means, as a second reference data.

In the above aspect, the fourth processing means subtracts the second reference data which was stored in the fourth memory means from the newest effective value which has been stored in the third memory means, and thereby calculate a second effective value.

In the first invention, the fourth processing means at first judges whether the effective value is no smaller than a predetermined value or not. And when the effective value is below the predetermined value, the fourth processing means erases the first instantaneous data stored in the second memory means and renews the data of the second memory means into the instantaneous data stored in the first memory means. Or when the effective value is below the predetermined value, the fourth processing means maintains the data stored in the second memory means for at least one period of the frequency of the AC power lines.

In the second invention, the fifth processing means at first judges whether the second subtracted data is above a predetermined value or not. And, when the second subtracted data is below the predetermined value, the fifth processing means erases the first instantaneous data (the first reference data) stored in the second memory means and renews it into the first instantaneous data stored in the first memory means. Furthermore, the fifth processing means erase the second reference data stored in the fourth memory means and renews it into the effective value stored in the third memory means. Or when the second subtracted data is above the predetermined value, it maintains the first and second reference data stored in the second and fourth memory means, respectively, for at least one period of the frequency of the AC power lines. The output means outputs the component of the normal frequency calculated by the second processing means to the burden means such as tripping mechanism.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF PREFERRED EMBODIMENTS

Figure 1:
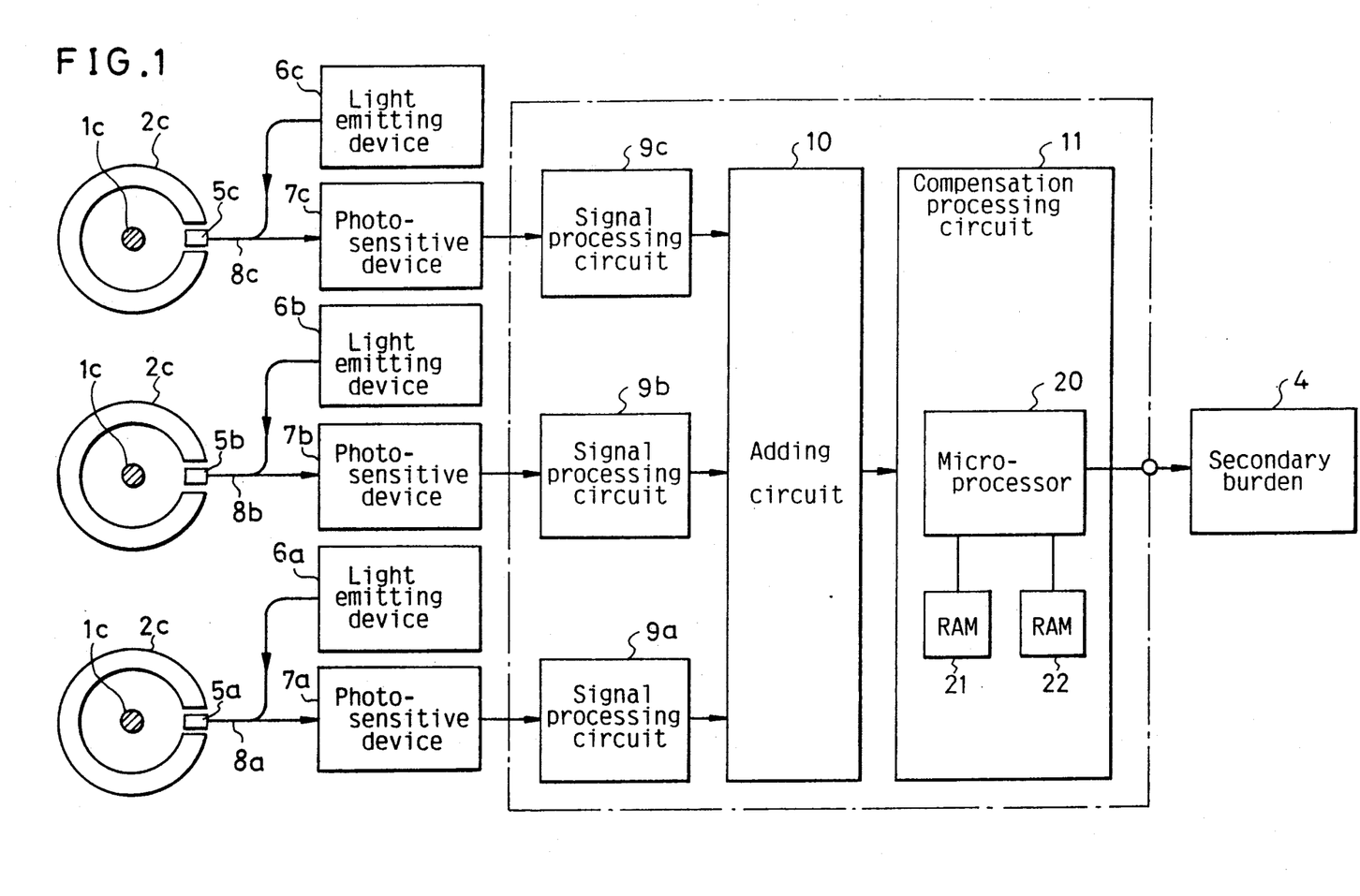
FIG. 1 is a block diagram showing a preferred embodiment of a zero-phase sequence current detector in accordance with the present invention.
Figure 2A:
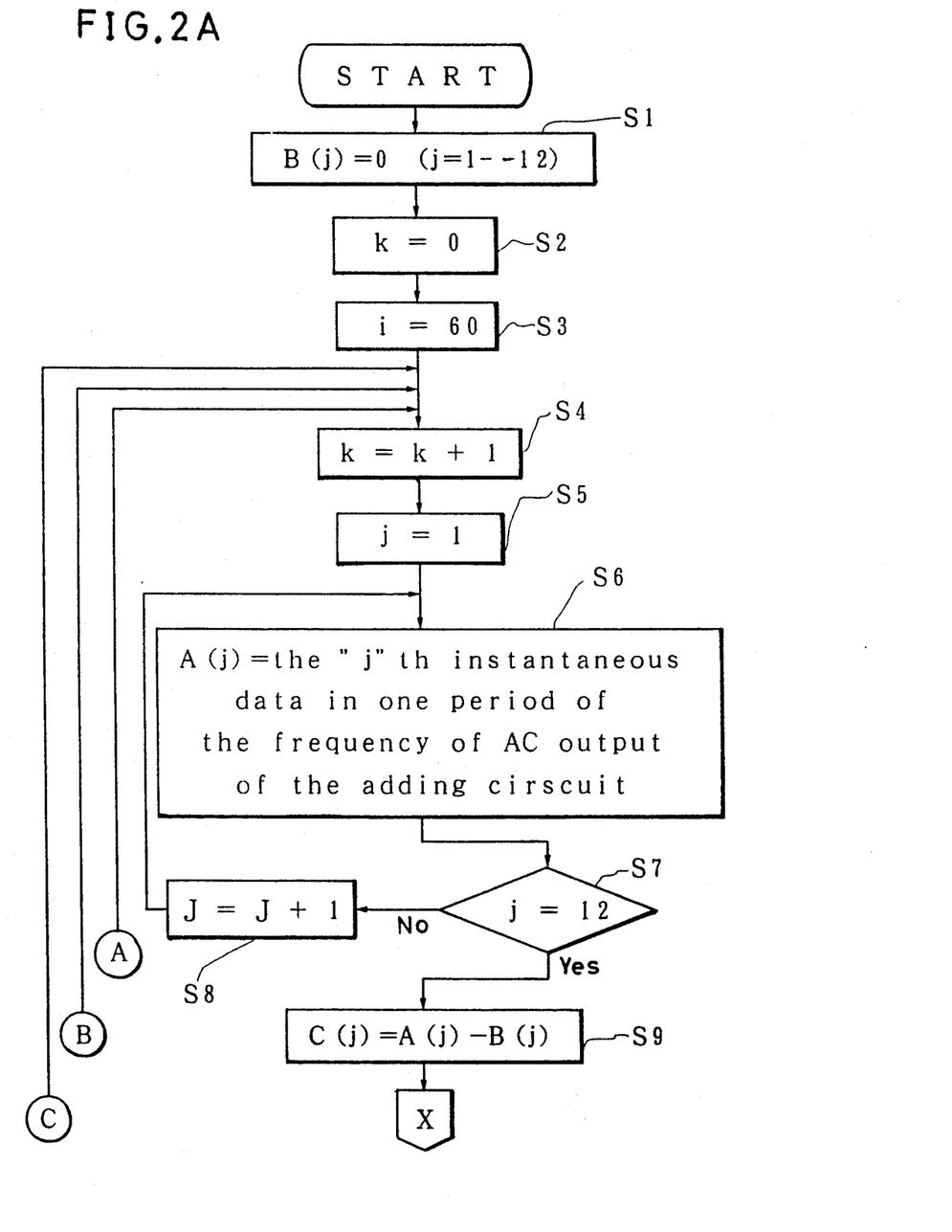
FIGS. 2A and 2B are a flow chart showing an operation of a correction processing circuit 11 in the first embodiment.
Figure 2B:
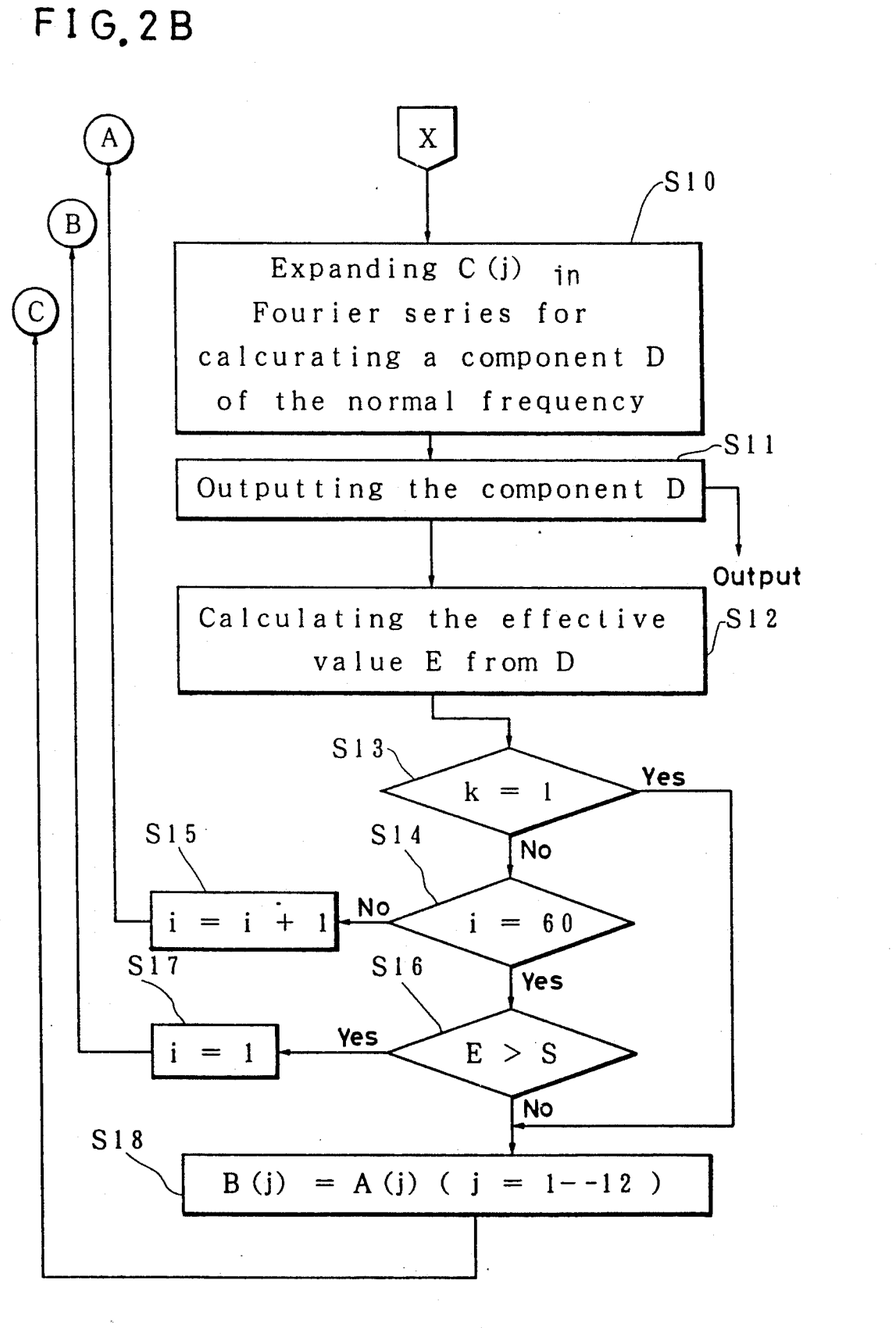
Figure 3A:
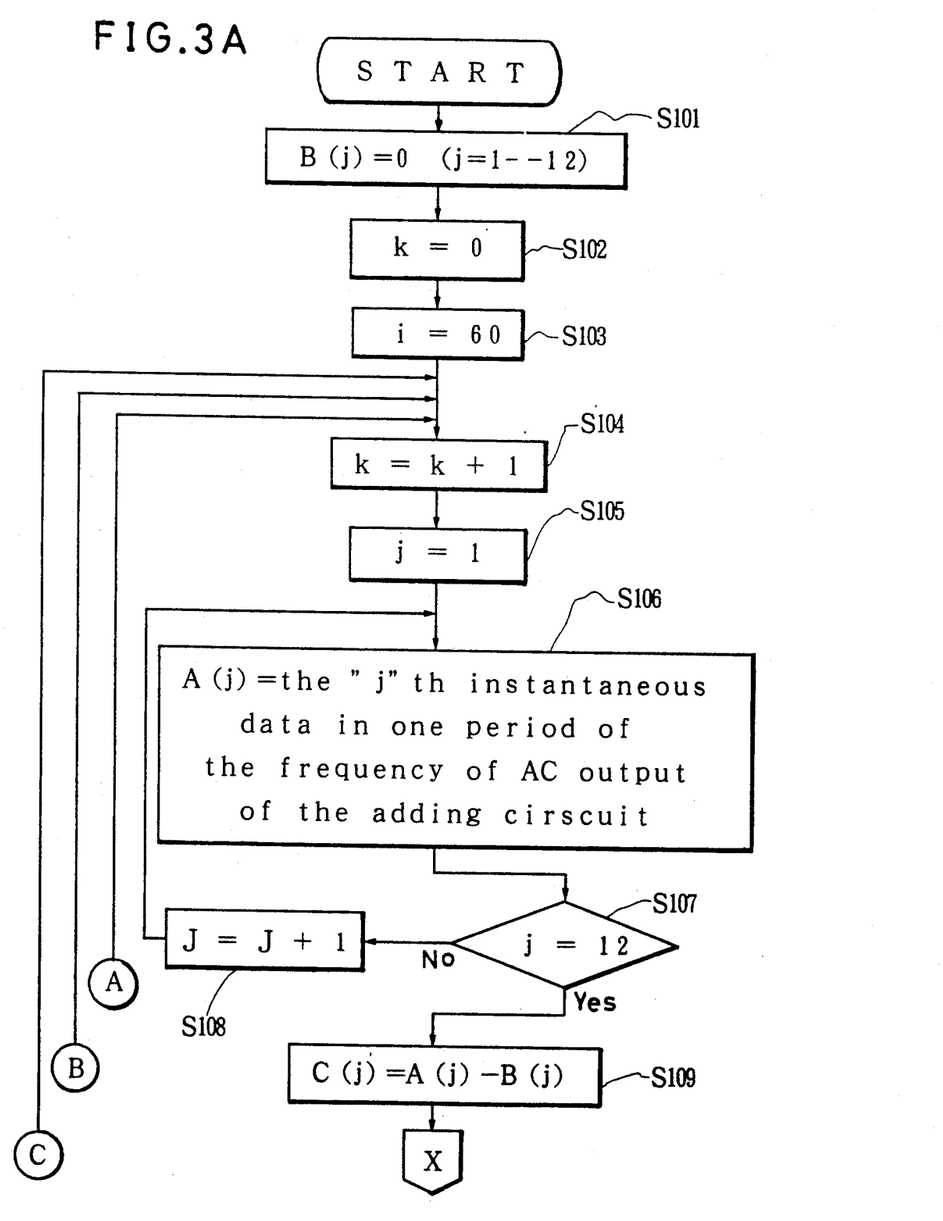
FIGS. 3A and 3B are flow chart showing an operation of a correction processing circuit 11 in the second embodiment.
Figure 3B:
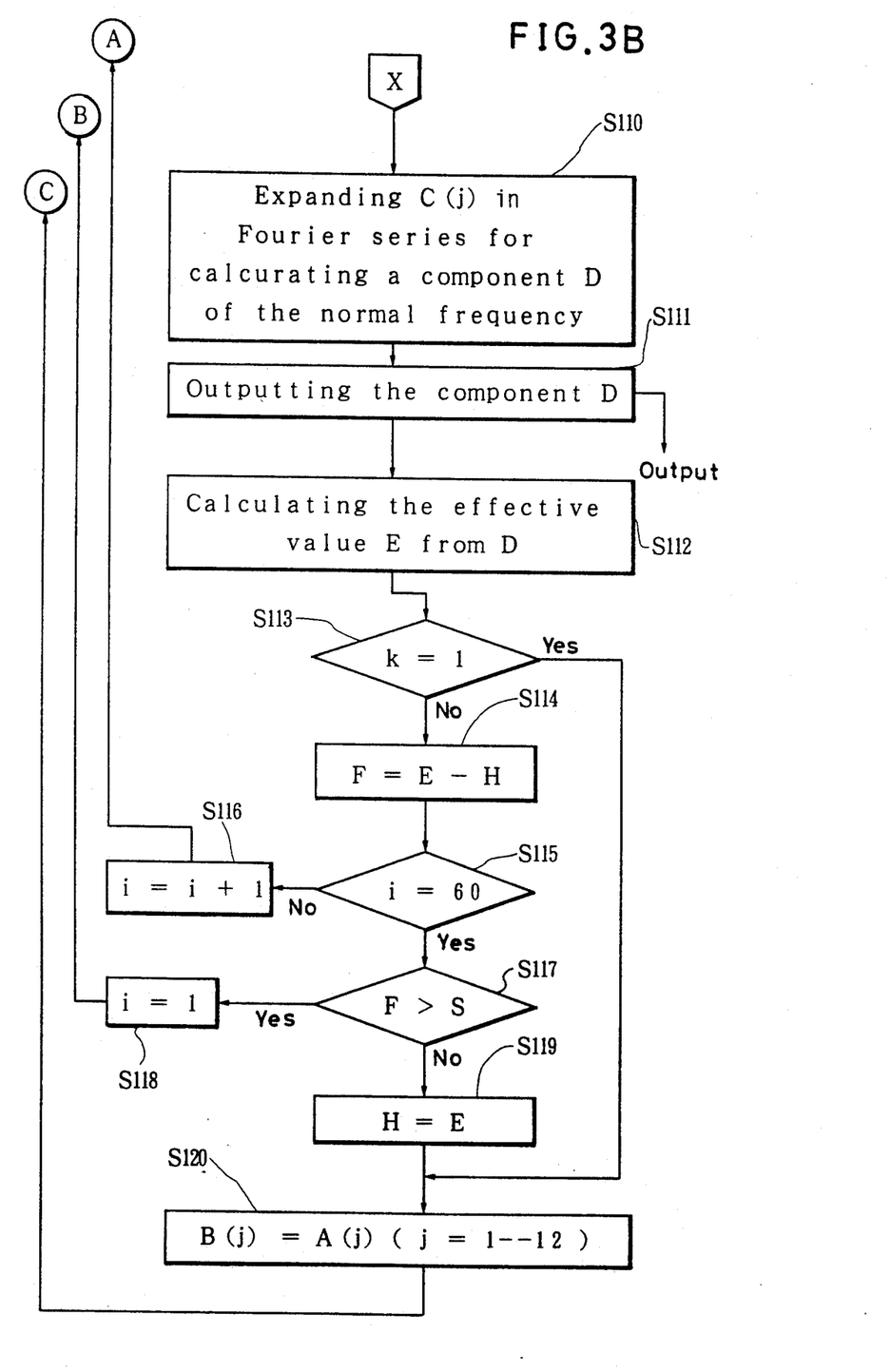

Preferred embodiments of a zero-phase sequence current detector in accordance with the present invention are described referring to FIGS. 1, 2 and 3.

In FIG. 1, circular cores 2a, 2b and 2c are provided on, for example, overhead lines of three phases of AC power lines 1a, 1b and 1c, respectively. In gaps of respective cores 2a, 2b and 2c, magnetoptic sensors 5a, 5b and 5c are provided. Light emitting devices 6a, 6b and 6c are connected to the magnetoptic sensors 5a, 5b and 5c via optical fibers 8a, 8b and 8c. And also, photosensitive devices 7a, 7b and 7c are connected to the magnetoptic sensors 5a, 5b and 5c via the optical fibers 8a, 8b and 8c. The measuring means is constituted by the circular cores 2a, 2b and 2c, the magnetoptic sensors 5a, 5b and 5c which are disposed in gaps made in the circular cores 2a, 2b and 2c, respectively, the light emitting devices such as LEDs 6a, 6b and 6c, the photo-sensitive devices such as photodiodes 7a, 7b and 7c and the optical fibers 8a, 8b and 8c. The light emitting devices 6a, 6b and 6c are optically connected to the magnetoptic devices 5a, 5b and 5c by the optical fibers and the photosensitive devices 7a, 7b and 7c are also optionally connected to the magnetoptic devices 5a, 5b and 5c by the optical fibers.

Magnetic fields responding to respective currents flowing on the power lines 1a, 1b, 1c of the three phases are induced in the circular cores 2a, 2b and 2c. At this time, light beams emitted from the light emitting devices 6a, 6b and 6c reach the magnetoptic sensors 5a, 5b and 5c via the optical fibers 8a, 8b and 8c. And the light beams are modulated in the magnetoptic sensors 5a, 5b and 5c responding to the intensity of the magnetic fields in the respective gaps of the circular cores 2a, 2b and 2c. Furthermore, signals of the light beams return to the photosensitive devices 7a, 7b 7c via the optical fibers 8a, 8b and 8c and the light beams are converted to electric signals by the photosensitive devices 7a, 7b and 7c.

The magnetoptic sensors 5a, 5b and 5c are, for example, constituted by polarizers, faraday devices and analyzers. When the light beams linearly polarized into a polarized light by the polarizers pass through the Faraday devices, polarization planes of the light beams are rotated in the Faraday device responding to the intensity of component of the magnetic field applied in a direction of the light progression. Light beam is modulated by the rotation of the polarization planes of the light beams when it passes the analyzers. Each intensity of light modulated by the analyzer of a phase is sum or superposition of constant intensity component corresponding to a transmitted lights when the intensity of magnetic field applied in the magnetoptic sensor 5a, 5b or 5c is zero and AC component corresponding to changes of the of light intensity responding to the intensity of magnetic fields generated by AC current flowing on that phase.

The photosensitive devices 7a, 7b and 7c convert optical signals to electric signals of pulsating currents. And signal processing circuits 9a, 9b and 9c respectively converts the pulsating electric signals responding to the currents flowing on the power lines 1a, 1b and 1c. Adding circuit 10 adds these signals of three phases.

Normally, output of the adding circuit 10 is zero, since sum of the currents flowing on the power lines of respective phases 1a, 1b and 1c is zero.

On the contrary, when ground fault occurs on the power line 1a, 1b or 1c, the sum of the currents flowing on the power lines 1a, 1b and 1c does not become null and zero-phase sequence current flows as a result. And, value of the output of the adding circuit 10 is in proportion to the value of the zero-phase sequence current, and thereby, the ground fault on the power line 1a, 1b or 1c is detected.

The magnetoptic sensors 5a, 5b and 5c and the signal processing circuit 9a, 9b and 9c respectively, however, have the temperature characteristics actually. And usually there are differences among these temperature characteristics. Therefore, there are differences among actual ratios of the value of current flowing on the power lines of three phases 1a, 1b and 1c to the value of the output signals of the signal processing circuits 9a, 9b and 9c by the change of circumferential temperature. By such differences of the temperature characteristics of respective phases, output of the adding circuit 10 may not be zero even when the zero-phase sequence current does not flow. That is, there is a possibility that a secondary burden 4 may be erroneously driven.

A compensation processing circuit 11 is provided for preventing such an erroneous operation of the above mentioned secondary burden 4. The compensation processing circuit 11 comprises a microprocessor 20, RAM memories 21 and 22 serving as first, second, third and fourth memory means. Respective of the memories 21 and 22 have memory area sufficient to store the sampled data.

Generally, change in the error component of the zero-phase sequence current due to the ground fault is instantaneous. In view of the above-mentioned features, the compensation processing circuit 11 cancels the error component by executing the program shown in the flow chart of FIGS. 2A and 2B of FIGS. 3A and 3B, to detect the zero-phase sequence current due to the occurrence of the ground fault.

A first preferred embodiment of the present invention, which has a program to be executed by the compensation processing circuit 11 of the apparatus of the present invention is described referring to a flow chart of the program of FIGS. 2A and 2B.

In step S1, initial data are stored in a memory area of the memory 22 which serves as the second memory means. Ordinarily, "O"s are input to all addresses of the memory area. When the instantaneous data to be stored in the memory 22 are designated by B(j) ("j" designates the serial number of the data sampled for every predetermined electrical angles (30° in the example), twelve data of B(1) to B(12) are stored in the memory 22.

In steps S2 and S5, initial values "k"=0, i=60 and j=1 are set.

In step S6, the newest analogue data of one period of the frequency of AC current which is the output of the adding circuit 10 is digitalized as instantaneous data for every predetermined electrical angles, for example, 30° and stored in the memory 21 serving as the first memory means. When the data to be stored in the memory 21 are designated by A(j) ("j" is the serial number of the data sampled for every predetermined electrical angle), twelve data of A(1) to A(12) are stored in the memory 21.

In step S9, from the data A(j) at electrical angles which are stored in the first memory means such as a first memory area of the memory 21, subtracted respective corresponding data among the data B(j) having the same electrical angles which are stored in the second memory means such as a second memory area of the memory 22 for calculating subtracted data of respective electrical angles. That is, when the subtracted data are designated by C(j), the microprocessor 20 serving as the first processing means executes the subtracting calculation of equation of $$C(j) = A(j) - B(j).$$

Generally, the differences of temperature characteristics among the respective measuring means such as the magnetoptic sensors 5a, 5b and 5c and the signal processing circuit 9a, 9b and 9c make no substantial changes during in a short time period, for example, one second. Accordingly, it is considered that all the sampled data contain respective error components similarly due to differences of the temperature characteristics. Therefore, the error components due to the differences of the temperature characteristics of the measuring means are removed by off setting from the first subtracted data C(j) obtained by the above-mentioned subtracting process. In steps S7 and S8, the microprocessor 20 serves as a counter for calculating all of the subtracted data C(j) for all of the electrical angles.

In step S10, the microprocessor 20 serves as the second processing means. Namely, the microprocessor 20 expands the subtracted data C(j) in Fourier series for calculating a value of component of the normal frequency such as 60 Hz or 50 Hz. Generally, the output of the adding circuit 10 contains components of high frequency and low frequency of noises which are superposed on the component of the normal frequency. And, only the component of the normal frequency can be obtained by expansion in Fourier series. The calculated component of the normal frequency does not substantially contain error component.

In step S11, the miocroprocessor 20 serves as the output means for outputting the value, which corresponds to the calculated component of the normal frequency, to the second burden 4.

In step S12, the microprocessor 20 serves as the third processing means and calculates an effective value E from the calculated value of the component of the normal frequency.

In step S13, the microprocessor 20 judges whether k=1 or not. The instance when the value "k" on the counter is equal to 1 (k=1), is the time when the operation of the zero-phase sequence current detector just starts, and at that time the reference data which is stored in the second memory means are "0" (that is, nothing is stored). Therefore, the microprocessor 20 proceeds to step S18 for moving all the data primary sampled and stored in the first memory area in the memory 21 to the second memory area in the memory 22 before executing the next sampling.

In step S16, when the value "k" on the counter is not equal to 1, the microprocessor 20 serves as the fourth processing means and judges whether the effective value E is above a predetermined value S or not. As the predetermined value S, a suitable range is 50-90% of a driven level of a relay for detecting the ground fault in the secondary burden 4.

Hereupon, when the effective value E is smaller than the predetermined value S, it is in a normal state wherein no ground fault or the like exists. Then, in step S18, the microprocessor 20 erases all the data stored in the second memory area in the memory 22, and renews the data by storing therein the instantaneous data which has been stored in the first memory area in the memory 21 and the effective value E in the second memory area in the memory 22, for standing by the next processing.

When the effective value E is larger than the predetermined value S, it is in an abnormal case where the ground fault occurs and the power lines 1a, 1b and 1c must be tripped from power source and so on. Then, it is generally necessary to output a current corresponding to the zero-phase sequence current for about one second for driving the secondary burden 4 for tripping the power lines 1a, 1b and 1c from the power source. When the zero-phase sequence current, however, once occurs due to the ground fault. It is maintained at least until the power lines 1a, 1b and 1c are tripped from the power source. If the data stored in the second memory area in the memory 22 were erased in similar manner as in the case of no ground fault, the component of the zero-phase sequence current due to the ground fault might be canceled in the subtracting operation executed in step S9, since all the instantaneous data which are similarly sampled after the occurrence of the ground fault contain the component of the zero-phase sequence current due to the ground fault.

Therefore, for maintaining to output an output D of the component of the normal frequency corresponding to the zero-phase sequence current during one second, the original data stored in the second memory area in the memory 22 which do not contain the component due to the ground fault must be retained and the newest instantaneous data containing the component due to the ground fault only are renewed. Such a renewal process is repeated for one second, for example, 60 periods of the frequency of AC 60 Hz after detecting the zero-phase sequence current due to the ground fault. In the steps S14 and S15, the microprocessor 20 serves as a counter.

A second preferred embodiment of the present invention, which has another program to be executed by the compensation processing circuit 11 of the apparatus of the present invention, is described referring to a flow chart of the program of FIGS. 3A and 3B.

In step S101, initial data are stored in a memory area of the memory 22 which serves as the second memory means. Ordinary, "0"s are input to all addresses of the memory area. When the instantaneous data to be stored in the memory 22 are designated by B(j) ("j" designates the serial number of the data sampled for every predetermined electrical angle), twelve data of B(1) to B(12) are stored in the memory 22.

In steps S102 and S105, initial values k=0, i=60 and j=1 are set.

In step S106, the newest analogue data of one period of the frequency of AC current which is the output of the adding circuit 10 is digitalized as instantaneous data for every predetermined electrical angles, for example, 30° and stored in the memory 21 serving as the first memory means. When the data to be stored in the memory 21 are designated by A(j) ("j" is the serial number of the data sampled for every predetermined electrical angles), twelve data of A(1) to A(12) are stored in the memory 21.

In step S109, from the data A(j) at electrical angles, which are stored in the first memory means such as a first memory area of the memory 21, are subtracted respective corresponding data among the data B(j) at the same electrical angle which are stored in the second memory means such as a second memory area of the memory 22 for calculating subtracted data of respective electrical angles. That is, when the subtracted data are designated by C(j), the microprocessor 20 serving as the first processing means executes the subtracting calculation of equation of $$C(j) = A(j) - B(j).$$

In steps S107 and S108, the microprocessor 20 serves as a counter for calculating all of the subtracted data C(j) for all of the electrical angles.

In step S110, the microprocessor 20 serves as the second processing means. Namely, the microprocessor 20 expands the substracted data C(j) in Fourier series for calculating a value of component of the normal frequency such as 60 Hz or 50 Hz. Generally, the output of the adding circuit 10 contains components of high frequency and low frequency of noises which are superposed on the component of the normal frequency. And, only the component of the normal frequency can be obtained by expansion in Fourier series. The calculated component of the normal frequency does not substantially contain error component.

In step S111, the microprocessor 20 serves as the output means for outputting the value, which corresponds to the calculated component of the normal frequency, to the second burden 4.

In step S112, the microprocessor 20 serves as the third processing means and calculates an effective value E calculated in step S110 from the calculated value of the component of the normal frequency.

In step S113, the microprocessor 20 judges whether k=1 or not. The instance when the value "k" on the counter is equal to 1 (k=1), is the time when the operation of the zero-phase sequence current detector just starts, and at that time the first and second reference data which are stored in the second and fourth memory means are "0" (That is, nothing is stored). Therefore, the microprocessor 20 proceeds to step S120 for moving all the data which are sampled and stored in the first memory area in the memory 21 to the second memory area in the memory 22 before executing the next sampling.

In step S114, when the value "k" on the counter is not equal to 1, the microprocessor 20 serves as the fourth processing means and calculates a second subtracted data F by subtracting the second reference data H which is stored in the fourth memory area in the memory 22 from the effective value E of the component of the normal frequency.

In step S117, the microprocessor 20 serves as the fifth processing means and judges whether the second subtracted data F is above a predetermined value S or not. As the predetermined value S, a suitable range is 50-90% of a driven level of a relay for detecting the ground fault in the second burden 4.

Hereupon, when the second subtracted data F is smaller than the predetermined value S, it is in a normal state where no ground fault or the like exists. Then, in steps S119 and S120, the microprocessor 20 erases all the data stored in the second and fourth memory areas in the memory 22, and renews the data by storing therein the instantaneous data and the effective value stored in the first and third memory areas in the memory 21 and the effective value E in the second and fourth memory areas in the memory 22 for standing by the next processing.

When the effective value E is larger than the predetermined value S, it is an abnormal case where the ground fault occurs and the power lines 1a, 1b and 1c must be tripped from power source and so on. It is generally necessary to output current corresponding to the zero-phase sequence current for about one second for driving the second burden 4 for tripping the power lines 1a, 1b and 1c from the power source. When the zero-phase sequence current once occurs due to the ground fault, it is at least maintained until the power lines 1a, 1b and 1c are tripped from the power source. If the data stored in the second and fourth memory areas in the memory 22 were erased in the similar manner as in the case of no ground fault, the component of the zero-phase sequence current due to the ground fault might be canceled in the substracting operation executed in step S109 and S114, since all the instantaneous data which are sequentially sampled after the occurrence of the ground fault contain the component of the zero-phase sequence current due to the ground fault.

Therefore, for maintaining the output D of the component of the normal frequency corresponding to the zero-phase sequence current during one second, the original data stored in the second and fourth memory areas in the memory 22 which do not contain the component due to the ground fault must be retained and the newest instantaneous data containing the component due to the ground fault only are removed. Such a renewal process is repeated for the one second, for example, 60 periods of the frequency of AC 60 Hz after detecting the zero-phase sequence current due to the ground fault. In the steps S115 and S116, the microprocessor 20 serves as a counter.

In the above-mentioned embodiments, the predetermined electrical angle for sampling the data is selected to be 30°. However, when the processing speed (driving clock) of the microprocessor 20 can be made greater, the predetermined electrical angle can be made smaller than 30°. On the country, when the processing speed of the microprocessor 20 is smaller, the predetermined electrical angle must be made larger than 30°. And apart from the above mentioned, wherein the numbers of the instantaneous data to be stored in the memories 21 and 22 and to be used for processing the calculation of the effective value E are twelve for one period of the frequency of the AC current flowing on the AC power lines 1a, 1h and 1c, the number can be made more than two.

Furthermore, in the above-mentioned embodiments, the time period during which the effective value responding to the zero-phase sequence current has been output is one second (60 periods) after detecting the occurrence of the zero-phase sequence current due to the ground fault. But, when the relay for detecting the ground fault in the secondary burden 4 can be moved faster, the above-mentioned time period can be shorter than one second.

Still more, all of the compensation processing circuit 11, the signal processing circuits 9a, 9b and 9c and the adding circuit 10 can be integrated in the constitution of the microprocessor 20.

Figure 4:
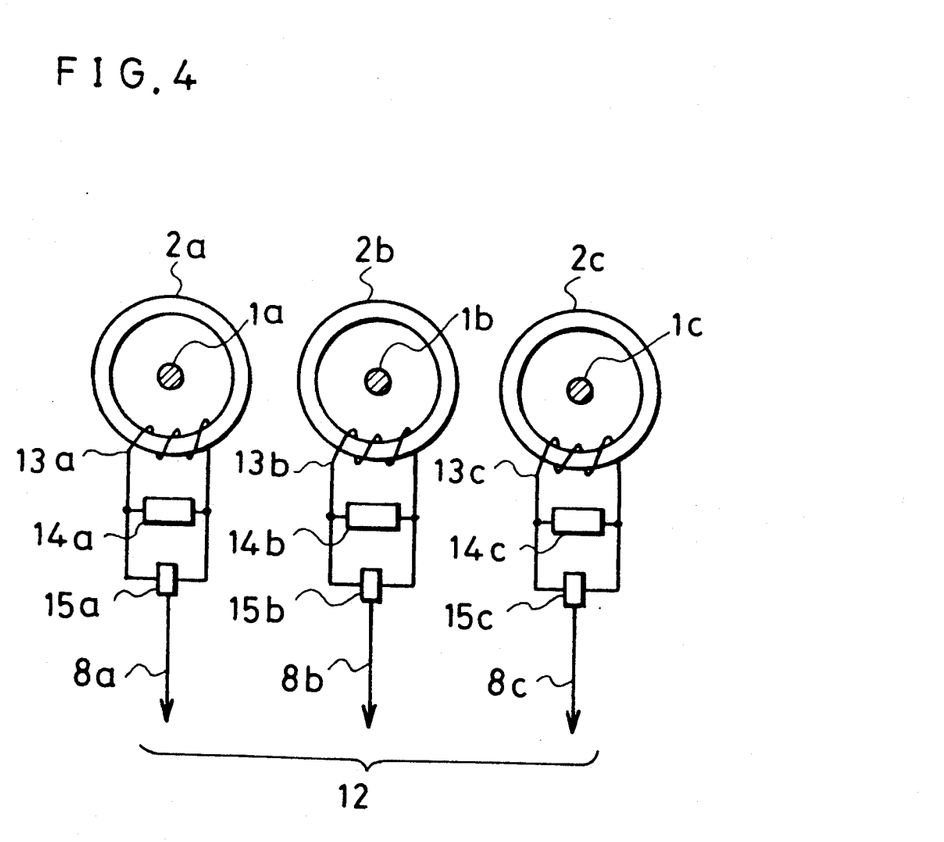
FIG. 4 is a drawing showing another embodiment of a measuring means of a zero-phase sequence current detector in accordance with the present invention.

Next, another embodiment of the part of the measuring means in the zero-phase sequence current detector in accordance with the present invention is shown in FIG. 4.

In FIG. 4, coils 13a, 13b and 13c are wound in parts of respective circular cores 2a, 2b and 2c. Resistors 14a, 14b and 14c are respectively connected between both ends of the respective coils 13a, 13b and 13c. Furthermore, magnetoptic sensors 15a, 15b and 15c which use Pockels effect are provided parallel to the resistors 14a, 14b and 14c for measuring voltages between both ends of the respective resistors 14a, 14b and 14c. In this embodiment, secondary currents, which are in proportion to the primary currents flowing on the power lines 1a, 1b and 1c, are obtained by coils 13a, 13b and 13c. The secondary currents are converted to the voltage signals by the resistors 14a, 14b and 14c and the voltage signals are detected by the magnetoptic sensors 15a, 15b and 15c.

Figure 5:
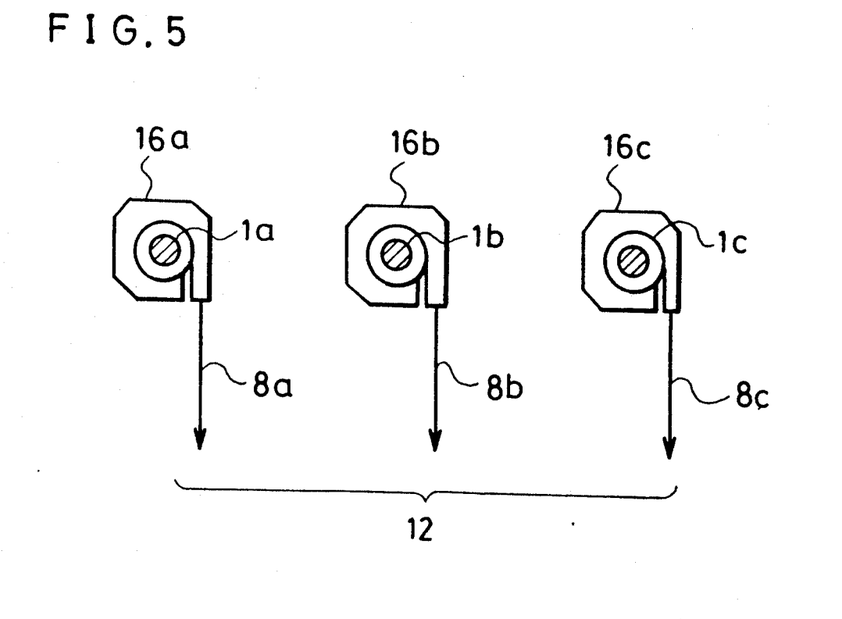
FIG. 5 is a drawing showing still other embodiment of a measuring means of a zero-phase sequence current detector in accordance with the present invention.

Still other embodiment of the measuring means is shown in FIG. 5.

In FIG. 5, magnetoptic sensors 16a, 16b and 16c which use Faraday effect are constituted as circular shape and enclose the power lines of the three phases 1a, 1b and 1c in the center part of the circular shape. In this embodiment, light beams introduced into the magnetoptic sensors 16a, 16b and 16c by the optical fibers 8a, 8b and 8c return to the photosensitive diodes such as 7a, 7b and 7c and are input to the measuring circuit 12. That is, the respective magnetoptic sensors 16a, 16b and 16c are constituted in a manner to repeat the reflection of the light in the interior thereof.

Although the invention has been described in its preferred form with a certain degree of particularity, it is understood that the present disclosure of the preferred form has been charged in the details of construction and the combination and arrangement of parts may be resorted to without departing from the spirit and the scope of the invention as hereinafter claimed.

What is claimed is:

1. A zero-phase sequence current detector comprising:

current measuring means provided for resepective phases of AC power lines for detecting current of the respective phases;

adding means for calculating zero-phase sequence current component by adding signals measured by said current measuring means;

first memory means for storing first instantaneous data of at least one newest periodic output of said adding means per a predetermined electrical angle;

second memory means for storing second instantaneous data, which are in the same number as said first instantaneous data stored in said first memory means, and have been instantaneous data or periodic output of said adding means corresponding to said predetermined electrical angle, detected prior to said first instantaneous data and stored in said first memory means;

first processing means for calculating subtracted data for respective electrical angles by subtracting said second instantaneous data stored in said second memory means from said first instantaneous data stored in said first memory means for respective corresponding electrical angles;

second processing means for calculating a component of a normal frequency only, by expanding said first subtracted data in Fourier series;

third processing means for calculating an effective value from said component of said normal frequency;

fourth processing means which judges whether said effective value is no smaller than a predetermined value or not, erases said second instantaneous data stored in said second memory means and restores said first instantaneous data stored in said first memory means in said second memory means when said effective value is no longer than said predetermined value and maintains said second instantaneous data stored in said second memory means for at least one period of frequency of said AC power line when said effective value is no smaller than said predetermined value; and output means for outputting said component of said normal frequency calculated by said second processing means to a burden means.

2. A zero-phase sequence current detector comprising:

current measuring means provided for respective phases of AC power lines for detecting current of the respective phases;

adding means for calculating zero-phase sequence current components by adding signals measured by said current measuring means;

first memory means for storing first instantaneous data of at least one newest periodic output of said adding means per a predetermined electrical angle;

second memory means for storing second instantaneous data as a first reference data, which are in the same number as said first instantaneous data stored in said first memory means, and have been instantaneous data of periodic output of said adding means corresponding to said predetermined electrical angle, detected prior to said first instantaneous data and stored in said first memory means;

first processing means for calculating first subtracted data of respective electrical angles by subtracting of respective of said second instantaneous data stored in said second memory means from said first instantaneous data stored in said first memory means for respective corresponding electrical angles;

second processing means for calculating a component of a normal frequency by expanding said first subtracted data in Fourier series;

third processing means for calculating an effective value from said component of said normal frequency;

third memory means for storing said effective value;

fourth memory means for storing a past effective value, which was calculated by said third processing means prior to said effective value to be stored in said third memory means, as a second reference data;

fourth processing means for calculating second subtracted data by subtracting said second reference data which was stored in said fourth memory means from newest effective value which has been stored in said third memory means;

fifth processing means which judges whether said second subtracted data is no smaller than a predetermined value or not, erases said first and second reference data, restores the newest first instantaneous data stored in said first memory means in said second memory means as a first reference data and restores the newest effective value stored in said third memory means in said fourth memory means as a second reference data when said second subtracted value is no longer than said predetermined value and maintains said first and the second reference data for at least on period of the frequency of the AC power lines when said second subtracted value is no smaller than above said predetermined value; and output means for outputting said component of said normal frequency calculated by said second processing means to a burden means.

* * * * *